(12) United States Patent
Wang et al.

(10) Patent No.: US 8,003,982 B2
(45) Date of Patent: Aug. 23, 2011

(54) STACKED MECHANICAL NANOGENERATOR COMPRISING PIEZOELECTRIC SEMICONDUCTING NANOSTRUCTURES AND SCHOTTKY CONDUCTIVE CONTACTS

(75) Inventors: Zhong L. Wang, Marietta, GA (US); Sheng Xu, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 312 days.

(21) Appl. No.: 12/338,131

(22) Filed: Dec. 18, 2008

(65) Prior Publication Data

US 2009/0115293 A1    May 7, 2009

Related U.S. Application Data

(63) Continuation-in-part of application No. 11/608,865, filed on Dec. 11, 2006.

(60) Provisional application No. 60/752,558, filed on Dec. 20, 2005, provisional application No. 60/759,637, filed on Jan. 18, 2006, provisional application No. 60/795,734, filed on Apr. 28, 2006, provisional application No. 60/796,442, filed on May 1, 2006.

(51) Int. Cl.
*H01L 27/20* (2006.01)
(52) U.S. Cl. .......... 257/43; 257/E27.006; 977/724; 977/730; 977/811; 977/948
(58) Field of Classification Search .......... 257/43, 257/E45.001, E27.006; 977/700, 701, 720, 977/721, 722, 724, 725, 730, 832, 837, 932, 977/948, 811; 310/339
See application file for complete search history.

(56) References Cited

U.S. PATENT DOCUMENTS

| | | | | |
|---|---|---|---|---|
| 6,559,550 | B2 * | 5/2003 | Herman | 290/1 R |
| 7,839,028 | B2 * | 11/2010 | Pinkerton | 310/10 |
| 2009/0309456 | A1 * | 12/2009 | Stollberg | 310/319 |
| 2010/0033059 | A1 * | 2/2010 | Choi et al. | 310/339 |
| 2010/0066208 | A1 * | 3/2010 | Choi et al. | 310/339 |
| 2010/0139750 | A1 * | 6/2010 | Kim et al. | 136/255 |
| 2010/0141095 | A1 * | 6/2010 | Park | 310/339 |
| 2010/0253184 | A1 * | 10/2010 | Choi et al. | 310/339 |

OTHER PUBLICATIONS

Jeon et al. "MEMS power generator with transverse mode thin film PZT", Sensors and Actuators A: Physical, vol. 122, No. 1, pp. 16-22, Jul. 29, 2005.*

* cited by examiner

*Primary Examiner* — Samuel Gebremariam
*Assistant Examiner* — Andrew O Arena
(74) *Attorney, Agent, or Firm* — Bryan W. Bockhop; Bockhop & Associates, LLC

(57) ABSTRACT

An electric power generator includes a first conductive layer, a plurality of semiconducting piezoelectric nanostructures, a second conductive layer and a plurality of conductive nanostructures. The first conductive layer has a first surface from which the semiconducting piezoelectric nanostructures extend. The second conductive layer has a second surface and is parallel to the first conductive layer so that the second surface faces the first surface of the first conductive layer. The conductive nanostructures depend downwardly therefrom. The second conductive layer is spaced apart from the first conductive layer at a distance so that when a force is applied, the semiconducting piezoelectric nanostructures engage the conductive nanostructures so that the piezoelectric nanostructures bend, thereby generating a potential difference across the at semiconducting piezoelectric nanostructures and also thereby forming a Schottky barrier between the semiconducting piezoelectric nanostructures and the conductive nanostructures.

18 Claims, 9 Drawing Sheets

US 8,003,982 B2

STACKED MECHANICAL NANOGENERATOR COMPRISING PIEZOELECTRIC SEMICONDUCTING NANOSTRUCTURES AND SCHOTTKY CONDUCTIVE CONTACTS

CROSS-REFERENCE TO RELATED APPLICATION(S)

This application is a continuation-in-part of, and claims the benefit of U.S. patent application Ser. No. 11/608,865, filed Dec. 11, 2006, which was a non-provisional of the following U.S. Provisional Patent Applications: Ser. No. 60/752,558, filed Dec. 20, 2005; Ser. No. 60/759,637, filed on Jan. 18, 2006; Ser. No. 60/795,734, filed Apr. 28, 2006; and Ser. No. 60/796,442, filed May 1, 2006, the entirety of each of which is hereby incorporated herein by reference.

STATEMENT OF GOVERNMENT INTEREST

This invention was made with support from the U.S. Government under grant number DE-FG02-07ER46394 awarded by the U.S. Department of Energy. The government may have certain rights in the invention.

BACKGROUND OF THE INVENTION

1. Field of the Invention

The present invention relates to electrical generators and, more specifically, to an electrical generator that employs a stack of piezoelectric semiconducting structures to convert mechanical energy into electrical energy.

2. Description of the Prior Art

A Schottky barrier is a metal-semiconductor junction that rectifies current and, thus, may be used as a diode. A metal-semiconductor junction that does not rectify current is called an Ohmic contact. The rectifying properties of a metal-semiconductor junction depend on the metal's work function, the band gap of the intrinsic semiconductor, and the type and concentration of dopants in the semiconductor.

A piezoelectric material is one that forms an electrical potential difference between two regions of the material when the material is subjected to uneven mechanical forces. For example, when certain piezoelectric materials are bent, they develop a positive voltage in one region and a negative voltage in another region.

Many micro-scale and nano-scale machines have been proposed for such uses as in vitro medical devices. However, most of these machines are limited by the size of the power source that drives them. Specifically, many such designs rely on chemical batteries to supply electrical power to the devices. Therefore, they can be no smaller than the battery used and are useful only so long as the battery is able to provide power.

Semiconducting and piezoelectric nanowires have exciting potential in applications of electronics, optoelectronics, sensors, and the in situ biological sciences.

However, some of such devices need to be operational for long periods, rather than be limited by the lifespan of a battery. Also, it may be extremely difficult to change the batteries in some devices, such as environmental sensors.

Therefore, there is a need for electrical generators that are capable of providing power for long periods and that are driven by environmentally-available mechanical energy.

Therefore, the is a need for a generator employing semiconducting and piezoelectric nanowires to harvest energy from environmental conditions.

SUMMARY OF THE INVENTION

The disadvantages of the prior art are overcome by the present invention which, in one aspect, is an electric power generator that includes a first conductive layer, a plurality of semiconducting piezoelectric nanostructures, a second conductive layer and a plurality of conductive nanostructures. The first conductive layer has a first surface. The plurality of semiconducting piezoelectric nanostructures extends upwardly from the first surface. The second conductive layer has a second surface and is disposed parallel to the first conductive layer so that the second surface faces the first surface of the first conductive layer. The plurality of conductive nanostructures depends downwardly from the second surface. The second conductive layer is spaced apart from the first conductive layer at a distance so that when a force is applied to at least one of the first conductive layer and the second conductive layer, at least one of the semiconducting piezoelectric nanostructures engages at least one of the plurality of conductive nanostructures so that the at least one of the semiconducting piezoelectric nanostructures bends, thereby generating a potential difference across the at least one of the semiconducting piezoelectric nanostructures and also thereby forming a Schottky barrier between the at least one of the semiconducting piezoelectric nanostructures and the at least one of the conductive nanostructures.

In another aspect, the invention is a stacked electric power generator that includes a first conductive layer, a second conductive layer, and a plurality of intermediate conductive layers. The first conductive layer has a first surface and a plurality of semiconducting piezoelectric nanostructures extend upwardly from the first surface. The second conductive layer has a second surface and is disposed parallel to the first conductive layer so that the second surface faces the first surface of the first conductive layer. A plurality of conductive nanostructures depends downwardly from the second surface. The plurality of intermediate conductive layers is disposed between the first conductive layer and the second conductive layer. Each intermediate conductive layer has an downwardly-facing surface facing the first conductive layer and an upwardly-facing surface facing the second conductive layer. A plurality of semiconducting piezoelectric nanostructures extends upwardly from each upwardly-facing surface and a plurality of conductive nanostructures depends downwardly from the downwardly facing surface. The first conductive layer, the second conductive layer and each of the plurality of intermediate conductive layers is spaced apart so at a distance so that when a force is applied to at least one of the first conductive layer and the second conductive layer, at least one of the semiconducting piezoelectric nanostructures engages at least one of the plurality of conductive nanostructures so that the at least one of the semiconducting piezoelectric nanostructures bends, thereby generating a potential difference across the at least one of the semiconducting piezoelectric nanostructures and also thereby forming a Schottky barrier between the at least one of the semiconducting piezoelectric nanostructures and the at least one of the conductive nanostructures.

In another aspect, the invention is a method of making an electric power generator, in which a plurality of generating units is created. Each generating unit created by: growing a plurality of semiconducting piezoelectric nanostructures extending upwardly from a first surface of a first conductive layer; and growing a plurality of conductive nanostructures depending downwardly from a second surface of the first conductive layer, thereby creating a generating unit. A plurality of generating units to form stacked generating units. In the stacked generating units, each second conductive layer of a first generating unit is spaced apart from the first conductive layer of a second generating unit at a distance so that when a force is applied to at least one of the first conductive layer and the second conductive layer, at least one of the semiconducting piezoelectric nanostructures engages at least one of the plurality of conductive nanostructures. This results in the bending of at least one of the semiconducting piezoelectric nanostructures, thereby generating a potential difference across the at least one of the semiconducting piezoelectric nanostructures and also thereby forming a Schottky barrier between the at least one of the semiconducting piezoelectric nanostructures and the at least one of the conductive nanostructures.

In another aspect, the invention is a generator for harvesting electrical energy from a pulsed source of mechanical energy that includes a conductive substrate, a plurality of semiconducting piezoelectric wires, an elastic and insulating polymer film and a metal layer. The plurality of semiconducting piezoelectric wires extends upwardly from the conductive substrate. The elastic and insulating polymer film is infiltrated into the plurality of semiconducting piezoelectric wires. The polymer film has a thickness so that a top portion of the semiconducting piezoelectric wires extend beyond the polymer film. The metal layer is disposed on the polymer film and is in electrical contact with the top portion of the semiconducting piezoelectric wires.

In yet another aspect, the invention is a method of making a generator, in which a layer of piezoelectric semiconducting film is applied on a conductive substrate. The piezoelectric semiconducting film is annealed at a preselected temperature to form a textured piezoelectric semiconducting film. A plurality of aligned piezoelectric semiconducting nanowires is grown from the textured piezoelectric semiconducting film. A layer of an insulative and elastic polymer is infiltrated into the piezoelectric semiconducting nanowires. The layer of insulative and elastic polymer is etched so as to expose tips of the piezoelectric semiconducting nanowires. A metal layer is deposited onto the layer of insulative and elastic polymer so that the metal layer is in contact with the tips of the piezoelectric semiconducting nanowires.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
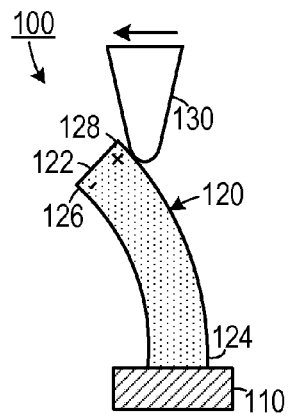
FIGS. 1A-1B are schematic diagrams of a first embodiment.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. Pat. Nos. 6,586,095 and 7,220,310 (both issued to Wang et al.) disclose methods of making nanowires that may be used in the embodiments disclosed below and, therefore, these patents are incorporated herein by reference.

Figure 1B:
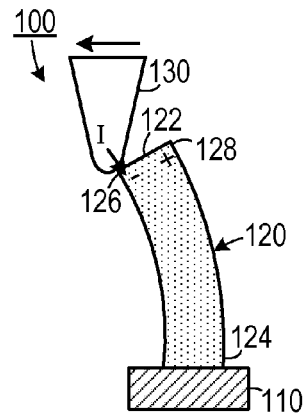

As shown in FIGS. 1A-1B, in one embodiment of a generator 110, a semiconductor piezoelectric structure 120, having a first end 122 and an opposite second end 124, extends from a substrate 110. The semiconductor piezoelectric structure 120 could include a nanostructure, such as a nanowire, a nano-rod, a nano-belt or a nano-tube. One representative nanostructure could include a zinc oxide structure, as a zinc oxide crystal exhibits both the property of being piezoelectric and of acting as a semiconductor.

When a conductive contact 130, e.g., a probe tip of an atomic force microscope, applies a force in the direction of the arrow, the semiconductor piezoelectric structure 120 bends, thereby creating a potential difference is created between a first side 126 (which is on the compressed side of the semiconductor piezoelectric structure 120) and a second side 128 (which is on the decompressed side). When the conductive contact 130 touches the second side 128, which has a positive potential relative to the first side 126, a reverse-biased Schottky barrier is formed between the conductive contact 130 and the second side 128. Because the Schottky barrier is reverse-biased, no current flows between the conductive contact 130 and the semiconductor piezoelectric structure 120. However, as the conductive contact moves across the semiconductor piezoelectric structure 120 and reaches the first side 126 (which has a negative potential relative to the second side 128), the Schottky barrier between the conductive contact 130 and the semiconductor piezoelectric structure 120 becomes forward-biased and current is allowed to flow through the Schottky barrier.

Zinc oxide (ZnO) exhibits both semiconducting and piezoelectric properties. One embodiment of an electric generator employs aligned ZnO nano-wire arrays for converting nano-scale mechanical energy into electric energy. The operating mechanism of the electric generator relies on the coupling of piezoelectric and semiconducting dual properties of ZnO as well as the rectifying function of the Schottky barrier formed between the metal tip 130 and the nano-wire 120. This approach has the potential of converting biological mechanical energy, acoustic or ultrasonic vibration energy, and biofluid hydraulic energy into electricity, which may result in self-powering of wireless nanodevices and nanosystems. These embodiments employ nano-wires (NWs) and nano-belts (NBs), including wurtzite structured materials (such as ZnO, GaN and ZnS) to create self-powering devices and systems (which could be built at the nanoscale).

One experimental embodiment employed mechanical manipulation of a single ZnO wire/belt 120 by a probe 130 coupled to an atomic force microscope (AFM). By selecting a long ZnO wire/belt 120 that was large enough to be seen under an optical microscope, one end of the ZnO wire was affixed on a silicon substrate by silver paste, while the other end was left free. The substrate was an intrinsic silicon, therefore its conductivity was relatively low. The wire 120 was laid horizontally on the substrate 110 (however, it was spaced apart from the substrate by a small distance to eliminate friction, except at the affixed end). The measurements were performed by an AFM using a Silicon tip coated with platinum film, which had a tetrahedral shape with an apex angle of 70°, was 14 μm in height, and had a spring constant of 1.42 N/m. The measurements were done in AFM contact mode under a constant normal force of 5 nN between the tip and the sample surface with a scan area of 70×70 μm.

Both the topography (feed back signal from the scanner) and the corresponding output voltage (V) images across a load were recorded simultaneously when the AFM tip was scanned across a wire or a belt. The topography image reflected the change in normal force perpendicular to the substrate, which showed a bump only when the tip scans over the wire. The output voltage between the conductive tip and the ground was continuously monitored as the tip scanned over the wire or the belt. No external voltage was applied in any stage of the experiment.

The AFM tip 130 was scanned line-by-line at a speed of 105.57 μm/s perpendicular to the wire either from above the top end to the lower part of the wire or from the lower part towards the top end. For a wire with a hexagonal cross-section, three characteristic features were observed. When the tip scanned above the top end of the wire without touching the wire, the output voltage signal was nothing but noise. When the tip scanned until it touched the top end of the wire, a spark output voltage signal was observed. The output voltage is negative for the load $R_L$ for almost all of the observed cases, indicating the tip has a lower potential than the grounded silver paste. When the tip 130 scanned down along the wire 120, it deflected the wire but could not go over it, and the output voltage showed no peak but noise.

When subjected to a displacement force, one side of the nano-wire 120 was stretched, and the other side was compressed. The observed results are summarized as follows: First, piezoelectric discharge was observed for both wire and belt, and it occurred only when the AFM tip touched the end of the bent wire/belt. Second, the piezoelectric discharge occurred only when the AFM tip touched the compressed side of the wire/belt, and there was no voltage output if the tip touched the stretched side of the wire/belt. Third, the piezoelectric discharge gives negative output voltage as measured from the load $R_L$. Finally, while viewing a topography image, it was noticed that the voltage output event occurred when the AFM tip was about finished crossing the width of the wire/belt 120, which means that the discharge event was delayed to the last half of the contact between the tip 130 and the wire/belt 120.

In order to explain the observed phenomena, we now examine the potential distribution in the wire/belt 120 based on piezoelectric induced potential distribution. We simply consider the polarization introduced in a belt as a result of elastic deformation. The relationship between strain ($\epsilon$) and the local piezo-electric field ($\epsilon$) is given by $\epsilon$=dE, where d is the piezoelectric coefficient. For a belt of thickness T and length L under the displacement of an external force F from the AFM tip applied perpendicularly at the top of the belt (z=L), a strain field in the belt would be formed. For any segment of the belt along its length, the local bending is described by its local curvature 1/R, R is the local radius for describing the bending of the belt, which is related to the shape of the belt by:

$$\frac{1}{R} = \frac{d^2 y}{dz^2}$$

which was from the geometrical shape of the curved belt. The shape of the belt can be described by the static deflection equation of the belt:

$$\frac{d^2 y}{dz^2} = \frac{F \cdot (L - z)}{YI}$$

where Y is the elastic modulus of the belt and I is its momentum of inertia. The local strain in the belt is given by $\epsilon$=y/R, and the corresponding electric field along the z-axis is given by:

$$E_z = \frac{\varepsilon}{d} = \frac{y}{d \cdot R}$$

This is the electric field that dominates the potential distribution under small bending approximation and the ignorance of the electric field effect on local strain via the piezoelectric effect. For simplicity, we consider the potential at the two side surfaces y=±T/2 by integrating the electric field along the entire length of the belt:

$$V^{\pm} = \int E \cdot ds = \pm \int \frac{T}{2d} \cdot \frac{1}{R} \cdot ds = \pm \frac{T}{2d} \cdot \int d\theta = \pm \frac{a}{d} \cdot \theta_{max}$$

where $\theta_{max}$ is the maximum deflection angle at the top of the wire. Since:

$$V^{\pm} = \pm \frac{TFL^2}{4dYI}$$

Using the relationship between the maximum deflection $y_m$ and the applied force:

$$F = \frac{3YIy_m}{L^3}$$

we have the potential induced by piezoelectric effect at the stretched and compressed side surfaces, respectively, being:

$$V^{\pm} = \pm 3Ty_m/4Ld$$

Examining the contact between the AFM conductive tip with the stretched and compressed side surfaces of the belt shows that the compressed side of the semiconductor ZnO wire/belt 120 has negative potential $V^-$ and the stretched side has positive potential ($V^+$). This is the cause of the two distinct transport processes across the Schottky barrier at the interface, as described below. When the tip contacts the stretched side surface, the Pt metal tip has a potential of nearly zero, $V_m=0$, the metal tip-belt interface is negatively biased for $\Delta V=V_m-V^+<0$. With consideration the n-type semiconductor characteristic of the as-synthesized ZnO belt, the Pt metal—ZnO semiconductor (M-S) interface in this case is a reversely biased Schottky diode, resulting in little current flowing across the interface. In this case, the piezoelectric static charges, mainly due to $Zn^{2+}$ and $O^{2-}$ ions, are accumulated and preserved, but without creating a current flow through the belt. This is a key process that prevents the slow "leakage" of the current as the deformation is being built up by the tip, otherwise, no observable output electric signal in the next step. As the tip continues to scan and touches the compressed side of the belt, the metal tip—belt interface is positively biased for $\Delta V=V_L=V_m-V^->0$. The interface is thus a positively biased Schottky diode, and it is possible to have current flow from the tip through the belt 120. The flow of electrons is to neutralize the piezoelectric ionic charges distributed in volume, resulting in a sudden increase in the output electric current. The output voltage measured on the load is negative in reference to the grounded root of the belt with consideration the flowing direction of the current.

The elastic deformation energy as created by the displacement force F is mainly dissipated in three ways: creating mechanical resonance/vibration after releasing the belt 120, generating piezoelectric discharge energy for each cycle of the vibration, and overcoming the friction and viscosity, if any, from the environmental and substrate. The mechanical resonance of the belt 120 may continue for many cycles, but it is eventually damped by the viscosity of the medium. The piezoelectric voltage output is generated in each cycle of the vibration, but the AFM tip 130 in the experimental design may be too slow to collect the electric signal output from each cycle of the belt vibration. It was found that the discharge signal can sometimes be collected for an extensive period of time, during which the belt may have resonated for over 10 cycles, producing a continuous and constant output DC voltage. As the resonance frequency of the wire was about 10 KHz, and the scanning speed of the tip was about 10 μm/s, it is feasible that the wire 120 had contacted the AFM probe tip 130 over 100 times before it departed to the point that it was too far away to make contact. It was observed that a piezoelectric output voltage is created in each cycle of vibration. Thus a DC power source can be created by continuously collecting the output voltage.

There is current flow only when the AFM tip 130 is in contact with the compressed side of the belt/wire. If the AFM probe tip 130 contacts the stretched side 128, no output current is possible even under extremely large elastic deformation. This expected result was observed where a ZnO wire was subjected to a large deformation, but no output voltage was received.

By deflecting a wire/belt 120 using a conductive AFM tip 130 in contact mode, the energy was first created by the deflection force and stored by piezoelectric potential, and later converted into piezo-electric energy. The mechanism of the generator is the result of coupled semiconducting and piezoelectric properties of ZnO. The piezoelectric effect is required to create electric potential of ionic charges from elastic deformation; the semiconducting property is required to preserve the charges and then release the potential via the rectifying behavior of the Schottky barrier at the metal-ZnO interface, which serves as a switch in the entire process. The good conductivity of ZnO makes current flow possible. This process may also be possible for wurtzite structured materials such as GaN and ZnS.

Figure 2A:
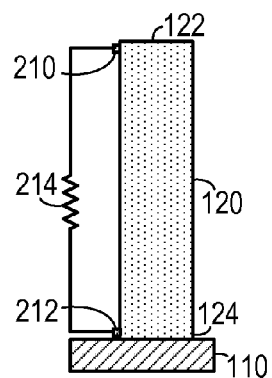
FIGS. 2A-2B are schematic diagrams of a second embodiment.
Figure 2B:
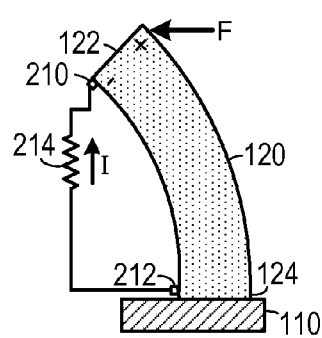

A second embodiment of a generator is shown in FIGS. 2A and 2B, in which a first conductive contact 210 is disposed at the first end 122 and a second conductive contact 212 is disposed at the second end 124. The second conductive contact 212 could be either placed against the semiconductor piezoelectric structure 120 or placed against the substrate 110 if the substrate 110 is made of a conductive material. A load 214 is coupled between the first conductive contact 210 and the second conductive contact 212 so that when a force is applied to the first end 122 in direction F, a current I flows through the load 214.

Figure 3A:
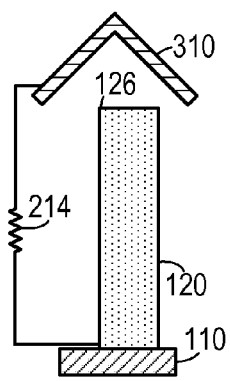
FIGS. 3A-3D are schematic diagrams of a third embodiment.
Figure 3B:
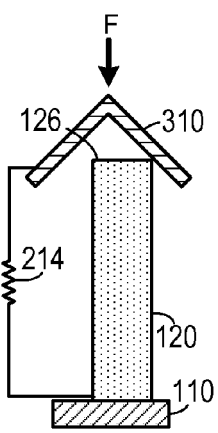
Figures 3C, 3D:
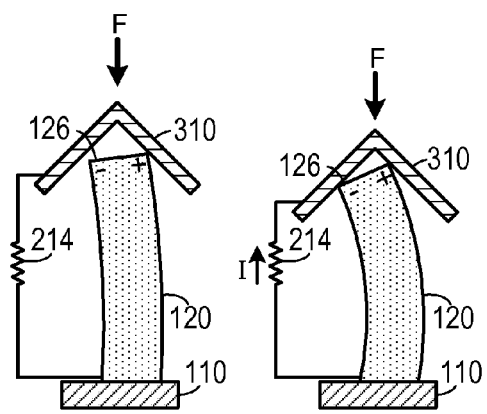

A third embodiment is shown in FIGS. 3A-3D. In this embodiment, the first conductive contact 310 has an uneven surface. As a downward force is applied to the first conductive contact 310, as shown in FIG. 3B, part of the semiconductor piezoelectric structure 120 makes contact with the first conductive contact 310. This causes the semiconductor piezoelectric structure 120 to bend and a potential difference forms between the two sides of the semiconductor piezoelectric structure 120. Initially, as shown in FIG. 3C, only the positive side of the semiconductor piezoelectric structure 120 is in contact with the first conductive contact 310, which creates a reverse-biased Schottky barrier through which no current flows. However, once the first conductive contact 310 has been pushed down far enough, the negative side of the semiconductor piezoelectric structure 120 makes contact with the first conductive contact 310, thereby forming a forward-biased Schottky barrier and allowing current to flow through the load 214. The fact that the positive side of the semiconductor piezoelectric structure 120 may still be touching the first conductive contact 310 makes no difference since the Schottky barrier between the positive side and the first conductive contact 310 is still reverse-biased and, therefore, no current will flow through the positive side.

Figure 4A:
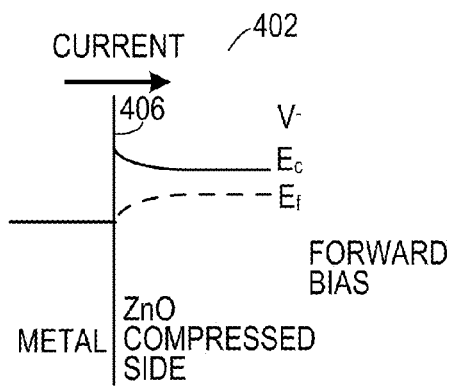
FIG. 4A is an energy band gap diagram showing the relative energy bands in a forward-biased device.
Figure 4B:
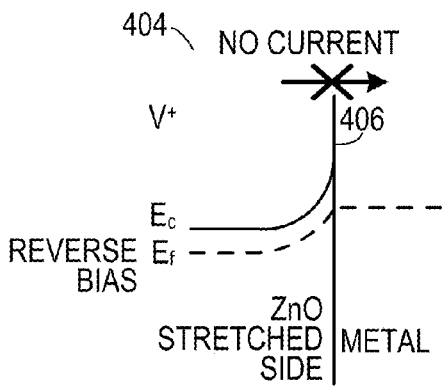
FIG. 4B is an energy band gap diagram showing the relative energy bands in a reverse-biased device.

The device in the forward-biased state has an energy band gap diagram 402 as shown in FIG. 4A, in which the conduction energy level ($E_c$) of the compressed side of the semiconductor piezoelectric structure (which is ZnO in the example presented) is greater than the Fermi energy ($E_f$) of the metal. Given that a negative potential ($V^-$) exists between the metal and the compressed side, current is able to flow from the metal to the semiconductor piezoelectric structure (using the convention that current represents the flow of charge from positive to negative) across the Schottky barrier 406. When the metal is in contact with the stretched side of the semiconductor piezoelectric structure, as shown in FIG. 4B, the conduction energy level ($E_c$) of the compressed side is not greater than the Fermi energy ($E_f$) of the metal and, since the stretched side has a positive potential relative to the potential of the metal, current is not allowed to flow across the Schottky barrier 406.

Figure 5A:
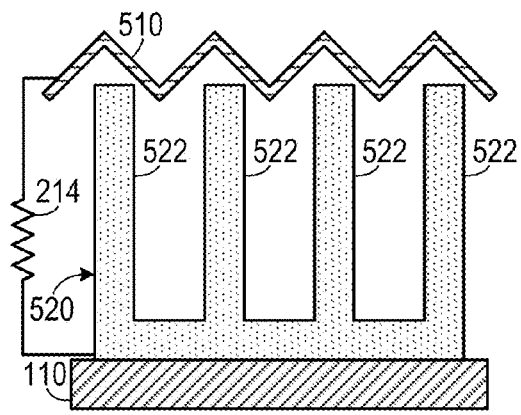
FIG. 5A is a schematic diagram of one embodiment.
Figure 5B:
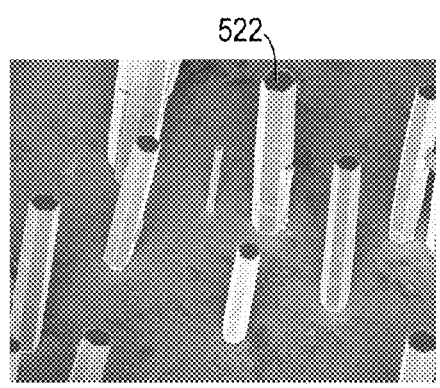
FIG. 5B is a micrograph of a plurality of nanostructures of a type that may be employed in the embodiment shown in FIG. 5A.
Figure 6A:
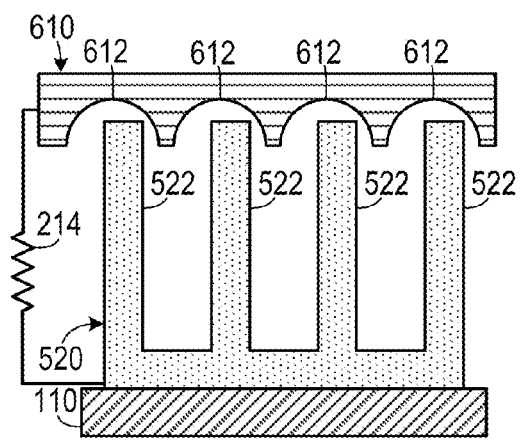
FIG. 6A is a schematic diagram of an embodiment employing nano-bowls.
Figure 6B:
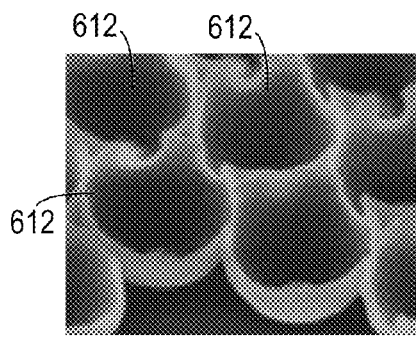
FIG. 6B is a micrograph of a plurality of nano-bowls of a type that may be employed in the embodiment shown in FIG. 6A.

One embodiment, as shown in FIG. 5A, employs an array 520 of zinc oxide (ZnO) nanostructures 522 with a corrugated conductor 510 placed above the nanostructures 522. A load 214 is coupled to the base of the nanostructure array 520 (forming an Ohmic contact therebetween) and to the corrugated conductor 510. A micrograph of suitable ZnO nanostructures 522 is shown in FIG. 5B. In an alternate embodiment, as shown in FIG. 6A, a sheet 610 defining a plurality of nano-bowls 612 is used as the conductive contact. A micrograph of a plurality of nano-bowls 612 is shown in FIG. 6A. Suitable nano-bowls may be fabricated according to a method disclosed in detail in U.S. Patent Application Publication No. US-2005-0224779-A1 (Ser. No. 11/010,178, filed on Dec. 10, 2004), the entirety of which is incorporated by reference herein. This embodiment could be employed in generating electricity from body movement. For example, this embodiment could be applied to the soles of a pair of shoes to generated electricity while the person wearing the shoes walks.

Figure 7:
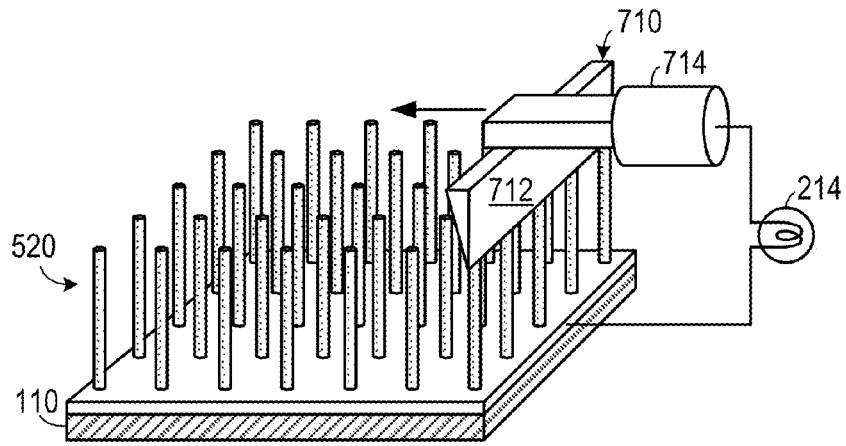
FIG. 7 is a schematic diagram of an embodiment that employs a reciprocating blade.

An embodiment that employs an array of nanowires 520 that are activated by a reciprocating contact 710 is shown in FIG. 7. The reciprocating contact 710, which is coupled to a load 214, includes a metal contact blade 712 that is driven by an actuator 714, such as a piston-type actuator.

Figure 8A:
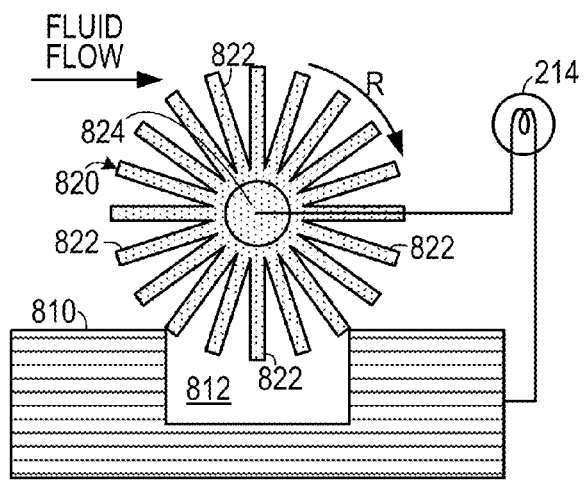
FIG. 8A is a schematic diagram of a rotational embodiment.
Figure 8B:
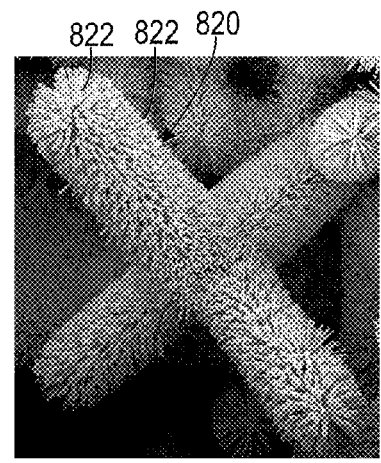
FIG. 8B is a micrograph of radially-disposed nanostructures of a type that may be employed in the embodiment shown in FIG. 8A.

A rotating generator is shown in FIG. 8A, in which a semiconductor piezoelectric structure 820 includes a plurality of nanorods 822 extending radially from a core 824 and that is capable of rotating about an axis in rotational direction R. The conductive contact 810, which is coupled to a load 214, defines an opening 812 that is disposed so that as the nanorods 822 are drawn against edges of the contact 810 as the semiconductor piezoelectric structure 820 rotates. In this embodiment, flowing fluid can cause the semiconductor piezoelectric structure 820 to rotate much in the way that a windmill rotates. This embodiment could be used as a generator within fluid flow structures, such as a blood vessel or a water pipe.

Figure 9A:
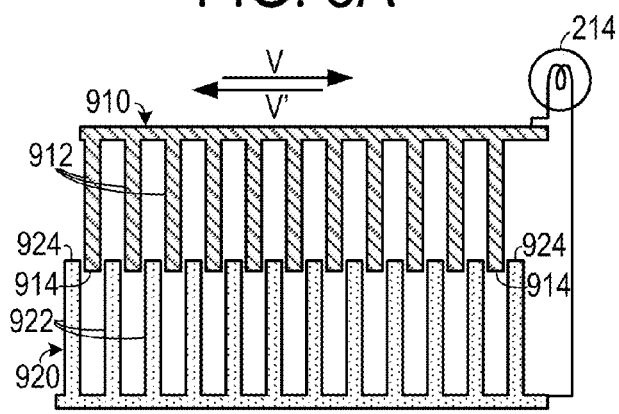
FIG. 9A is a schematic diagram of an embodiment employing two sets of nano-wires.
Figure 9B:
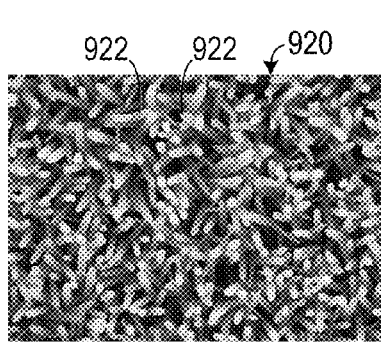
FIG. 9B is a micrograph of a plurality of nano-wires of a type that may be employed in the embodiment shown in FIG. 9A.
Figure 10A:
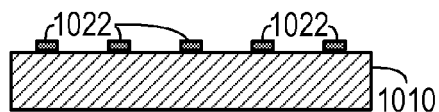
FIGS. 10A-10D are a series of schematic diagrams that demonstrate a method of making a sheet embodiment.
Figure 10B:
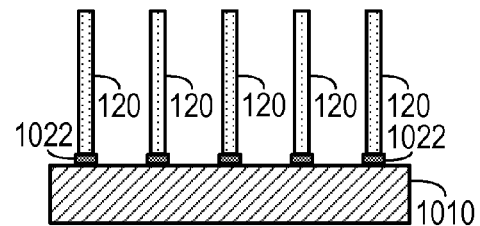
Figure 10C:
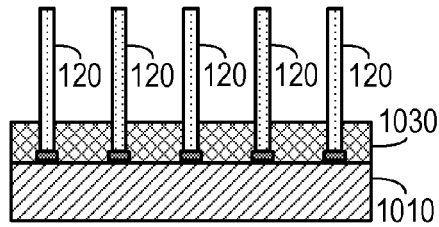
Figure 10D:
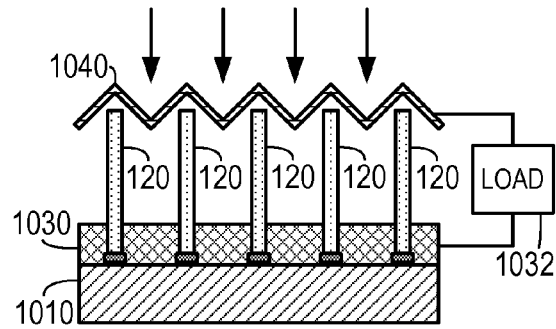

An embodiment for converting vibrational energy into electrical energy is shown in FIG. 9A, in which an array 920 of semiconductor piezoelectric nanostructures 922 is placed in an opposing relationship to an array 910 of conductive nanorods 912, and is coupled thereto via a load 214. A first end 924 of at least some of the semiconductor piezoelectric nanorods 922 is adjacent to a first end 914 of at least some of a set of the conductive nanorods so that as the conductive nanorods 912 vibrate laterally (in directions V and V') with respect to the semiconductor piezoelectric nanorods 922, a forward-biased Schottky barrier is formed by contact of at least one of the conductive nanorods 912 and at least one of the semiconductor piezoelectric nanorods 922, thereby generating an electrical current. A micrograph of an array 920 of semiconductor piezoelectric nanorods 922 is shown in FIG. 9B.

In one method of making a generator, as shown in FIGS. 10A through 10D, a plurality of catalyst particles 1022 (such as gold particles) is placed on a substrate 1010. Zinc oxide nano-wires 120 are then grown from the catalyst particles 1022 using a process of the type disclosed in U.S. Patent Application Publication No. US-2005-0224779-A1. A deformable layer 1030, such as a layer of an organic polymer, is deposited onto the substrate 1010 to a level so that the deformable layer 1030 surrounds each of the plurality of zinc oxide semiconductor piezoelectric structures 120 to a predetermined level. An uneven conductive contact layer 1040 is placed above the nano-wires 120 so that as a downward force (in the direction of the arrows) is applied to the conductive contact layer 1040, forward-biased Schottky barriers are formed (in the manner discussed with reference to FIGS. 3A-3D) and a current is applied to the load 1032. In this embodiment, the deformable layer 1030, maintains the attitude of the nano-wires 120, keeps them separated and prevents them from peeling off of the substrate 1010.

This embodiment may be subjected to extremely large deformation, so that they can be used for flexible electronics as a flexible or foldable power source. One reason for choosing zinc oxide in this embodiment is that it is a biocompatible and bio-safe material and, thus, it has a potential for being implanted as a power source in the human body. The flexibility of the polymer substrate used for growing zinc oxide nano-wires makes it feasible to accommodate the flexibility of human muscles so that it can use mechanical energy (body movement, muscle stretching) in the human body to generate electricity.

Figure 11:
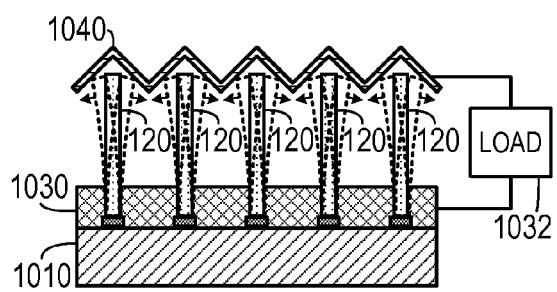
FIG. 11 is a schematic diagram showing operation of an embodiment in response to acoustic wave energy.

The embodiment shown in FIGS. 10A-10D may also respond to acoustic wave or ultrasonic wave energy, as shown in FIG. 11. Resonance of the nano-wires 120 as a one-end free beam can also generate electricity.

The principles and technology demonstrated here have the potential of converting mechanical movement energy (such as body movement, muscle stretching, blood pressure), vibration energy (such as acoustic/ultrasonic wave), and hydraulic energy (such as flow of body fluid, blood flow, contraction of blood vessel, dynamic fluid in nature) into electric energy that may be sufficient for self-powering nanodevices and nanosystems. The technology could have important applications in wireless self-powered nanodevices by harvesting energy from the environment. It may also provide a method for indirectly charging of a battery. It may be possible to fabricate large-power output electric generator by using arrays of ZnO wires/belts, which can be grown on substrates such as metal foils, flexible organic plastic substrates, ceramic substrates (such as alumina) and compound semiconductors (such as GaN and AlN). The nano-generator could be the basis for using self-powering technology for in-situ, real-time and implantable biosensing, biomedical monitoring and biodetection. It could have the potential of solving key energy requirement for remote sensing and actuating.

Figure 12:
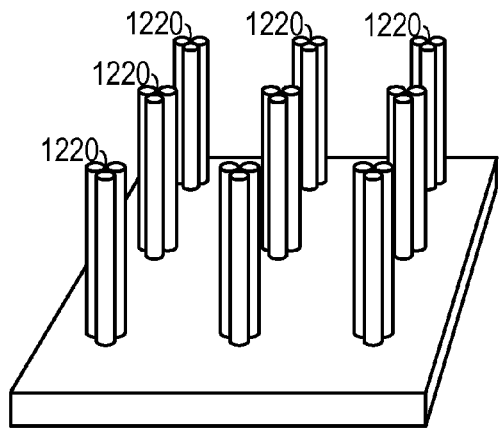
FIG. 12 is a top perspective view of a first patterned nanostructure embodiment.
Figure 13:
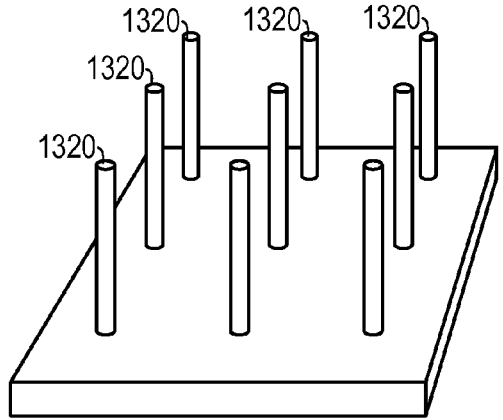
FIG. 13 is a top perspective view of a second patterned nanostructure embodiment.
Figure 14:
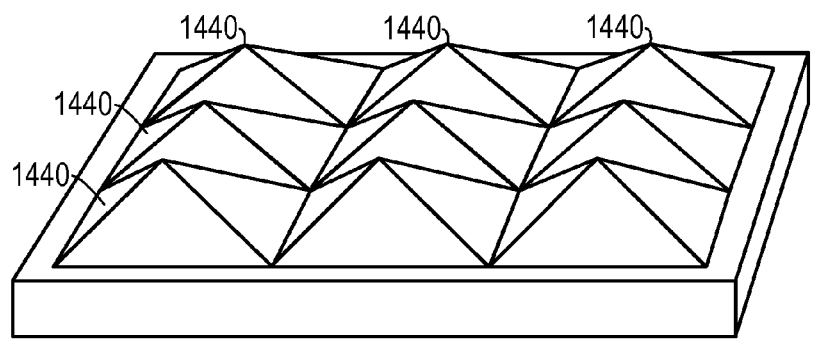
FIG. 14 is a top perspective view of a pyramidal conductive contact embodiment.
Figure 15A:
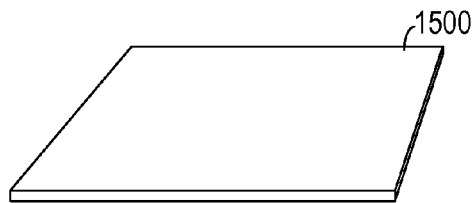
FIGS. 15A-15F are a series views showing various stages in the development of a portion of a stacked electric power generator.
Figure 15D:
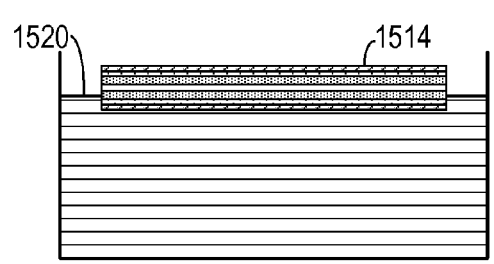
Figure 15B:
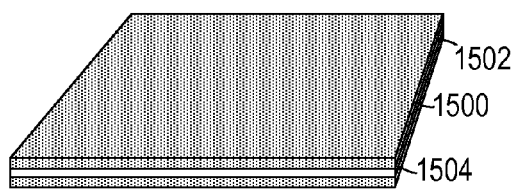
Figure 15E:
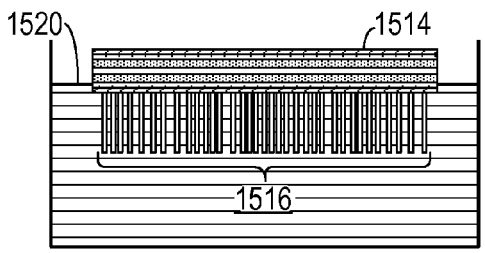
Figure 15C:
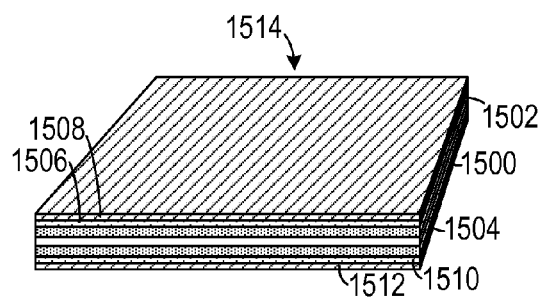
Figure 15F:
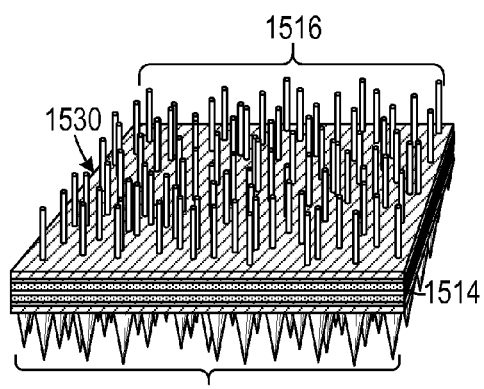

In one embodiment, as shown in FIG. 12, the nanostructures could be patterned in clusters 1220 or, as shown in FIG. 13, individual nanostructures 1320 arranged in a pattern. In one embodiment, as shown in FIG. 14, the conductive contact could include an array of conductive pyramids 1440.

As shown in FIGS. 15A-15G, one method of making a generating unit 1520 which may be employed in a stacked generating structure. A double-side polished Silicon (Si) wafer 1500 is coated with 100 nm thick $Al_2O_3$ layers 1502 and 1504 on both sides by atomic layer deposition. The film 1502, 1504 serves as an insulating layer to ensure independent operations of the nanogenerators to be built in the adjacent layers. Then the wafer is deposited with a 20 nm thick Cr layer 1506 and 1510 by direct current magnetron plasma sputtering on both the top and bottom. Following that, a 50 nm thick ZnO layer 1508 and 1512 is deposited by radio frequency magnetron sputtering onto the Cr layers 1506 and 1510 at the top and bottom surfaces, but not on the side surfaces. The Cr layers 1506 and 1510 serve not only as an adhesion to bind the $Al_2O_3$ layers 1502 and 1504 and the ZnO layers 1508 and 1512 together, but also as a common electrode for collecting the charges to be transported through the nanogenerators. The resulting wafer 1514 is then placed in a chemical solution 1520 to grow nanostructures thereon.

Aligned ZnO nanowire arrays may be grown according to the following method. Prior to exposure to the solution 1520, the wafer is rinsed by 4° C. 0.5 mmol/L $Zn(CH_3COO)_2$ in an ethanol solution on both sides and then baked at 350° C. for 15 min to form a layer of (0001) textured ZnO seeds, which leads to the growth of ZnO nanowires. The density of the ZnO seeds could be varied by using different concentrations of the $Zn(CH_3COO)_2$ ethanol solution. The morphology the ZnO arrays can be manipulated by using different growth temperatures for different lengths of time. Generally, at a relatively low growth temperature and relatively long growth time, nanowires 1516 are grown, while at a relatively high growth temperature and relatively short growth time, nanotips 1518 are grown. The morphology controlled growth of ZnO nanowire 1516 or nanotip 1518 arrays on different sides of the Si wafer is achieved by floating the substrate on the nutrient solution surface, which includes 5 mM 1-to-1 ratio of $Zn(NO_3)_2$ and hexamethylenetetramine. The nutrient solution may heated up to 100° C. for 24 hours for growing the pyramid-shaped nanotips 1518 or 70° C. for 48 hours for growing the hexagonal-prism-shaped nanowires 1516 independently for either side. Finally, the side with nanotips is coated uniformly with 100 nm thick Au by magnetron plasma sputtering to form a metal tip array 1518. (An alternate embodiment of a method of making nanotips is disclosed in U.S. patent application Ser. No. 12/194,914, filed on Aug. 20, 2008 by Wang et al., the entirety of which is hereby incorporated by reference.)

Figure 16:
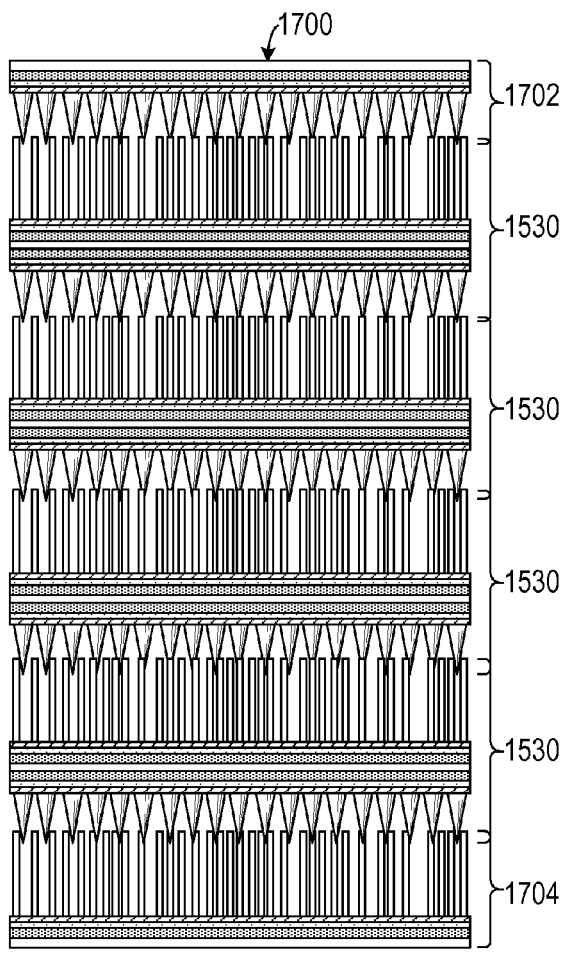
FIG. 16 is a schematic diagram of a stacked nanogenerator.

The resulting nanogenerating units 1530 may then be stacked to form a nanogenerator 1700, as shown in FIG. 16. The nanogenerator 1700 is made by stacking a nanogenerating unit 1530 on top of a partial nanogenerating unit 1704 (e.g., one that only includes the nanowire side), and then stacking a plurality of nanogenerating units 1530 on top of each other so that the nanotip portions partially interpenetrate with the nanowire portions. At the top of the stack, another partial nanogenerating unit 1702 (e.g., one that only includes the nanotip side) is placed so that the nanotips engage the nanowires.

The Au-coated nanotips act like the AFM tips shown in FIG. 1. Such a design neither has a strict requirement on the height uniformity of the nanowires nor needs to maintain a specific gap between the layers. In certain embodiments, insulative spacers (not shown) may be placed between the generating units 1530 to maintain a desired spacing during rest periods.

Figure 17:
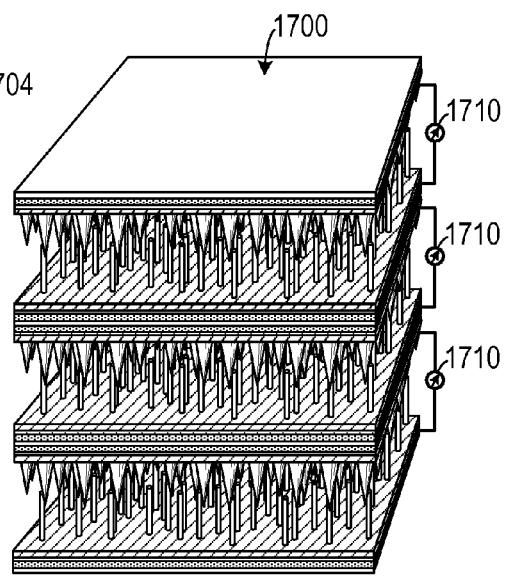
FIG. 17 is a perspective view of a stacked nanogenerator.
Figure 18A:
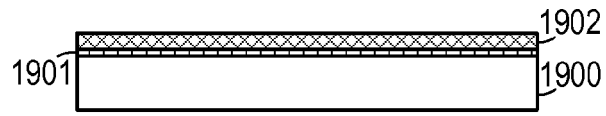
FIGS. 18A-18E are a series of schematic diagrams showing one embodiment of a method of making a generator for harvesting electrical energy from a pulsed source of mechanical energy.
Figure 18B:
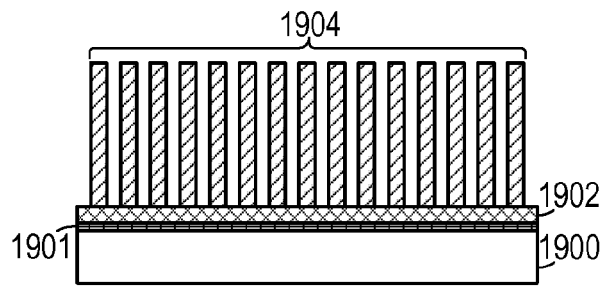
Figure 18C:
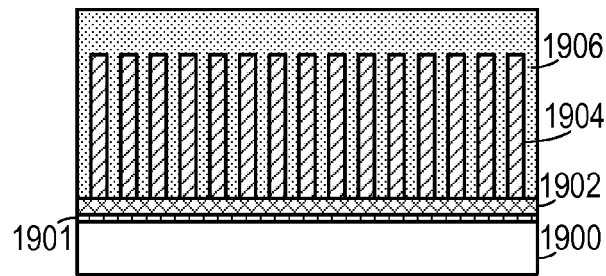
Figure 18D:
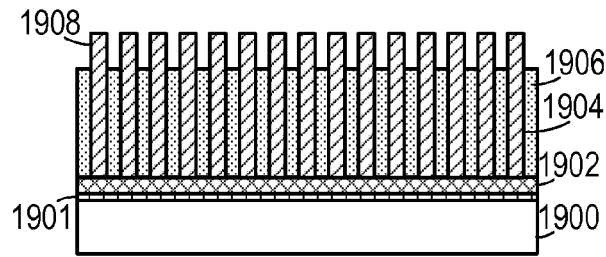
Figure 18E:
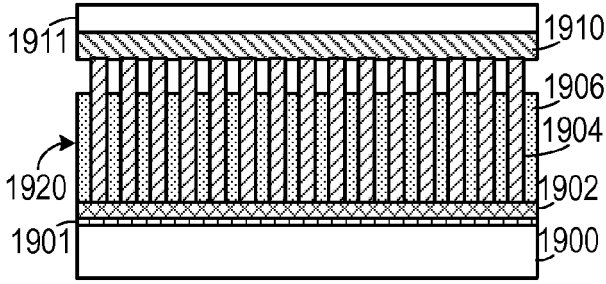

One configuration of a nanogenerator 1700 is shown in FIG. 17, in which a load 1710 is coupled to each generating unit. In other embodiments, the generating units 1530 may be coupled the load in parallel or in series to achieve a desired voltage/current characteristic.

In another embodiment, as shown in FIGS. 18A-18E, a thin Ti film 1901 is applied to a conductive substrate 1900 and an Au (or Pt) film 1902 is deposited onto the Ti film 1901 using magnetron plasma sputtering. The conductive substrate 1900 can include one of many materials, including a metal and a conductive polymer. The substrate 1900, the Ti film 1901 and the Au film 1902 are annealed at approximately 350° C. to form a textured ZnO film with its (0001) surface facing up to increase adhesion and reduce lattice strain of the Au film.

A plurality of aligned ZnO nanowires 1904 are grown using the chemical approach at low temperature (e.g., at less than 100° C.) described above. The nanowires 1904 are infiltrated with a thin insulating polymer layer 1906. In one embodiment, the polymer layer 1906 is flexible, elastic and soft.

The top surface is etched using a plasma etching process to expose the tips 1908 of the nanowires 1904. A silicon wafer 1911 deposited with a metal layer 1910 (such as platinum) by electron beam evaporator is carefully covered on top of the tips 1908. The metal layer 1910 forms a Schottky contact with the ZnO nanowires 1904. The metal layer 1910 includes a hard metal so that it can compress the nanowires 1904 axially to induce compressive strain in the nanowires 1904.

Figure 19:
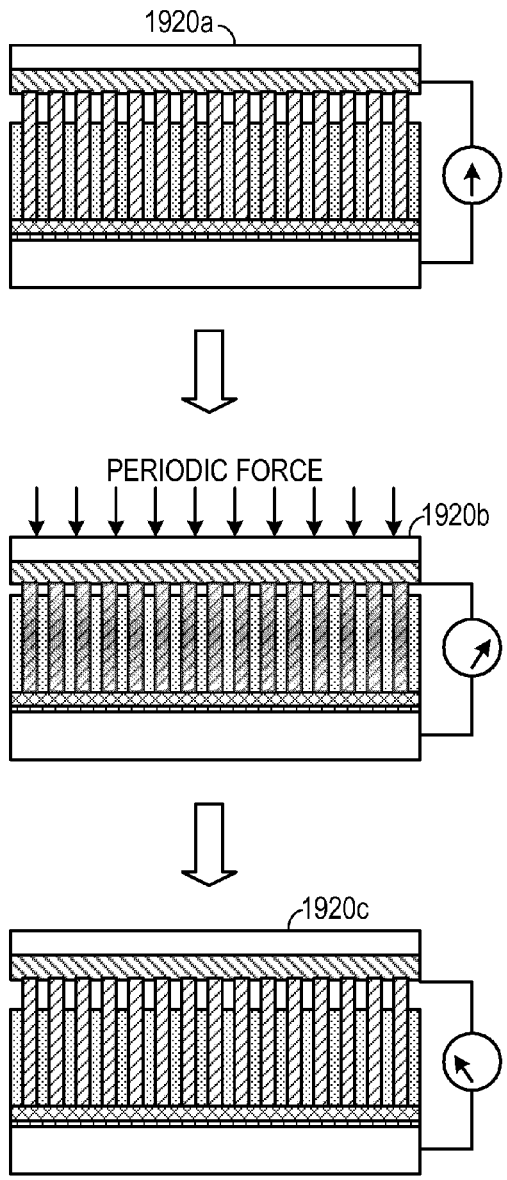
FIG. 19 is a pair of schematic diagrams that demonstrate operation of the embodiment shown in FIGS. 18A-18E

Since the nanowires 1904 have a common orientation along the c-axis, the piezoelectric field direction in each nanowire 1904 is the same. As shown in FIG. 19, if a periodic force is applied to the top of the structure 1920a, the nanowires 1904 will be axially compressed (1920b) and will produce a piezoelectric potential drop along the axial direction. This potential will drive the flow of electrons in the external circuit towards one direction, forming a transient current. The electrons will accumulate in the electrode to avoid a circular flow owing to the blocking of the Schottky barrier at one contact (i.e., the top electrode).

When the force is lifted from the structure 1920c, the nanowires recover to their free state and the back flow of the accumulated electrons through the external circuit forms a reversed flow current. The entire process produces an alternating current following with the frequency at which the external force is applied.

Figure 20:
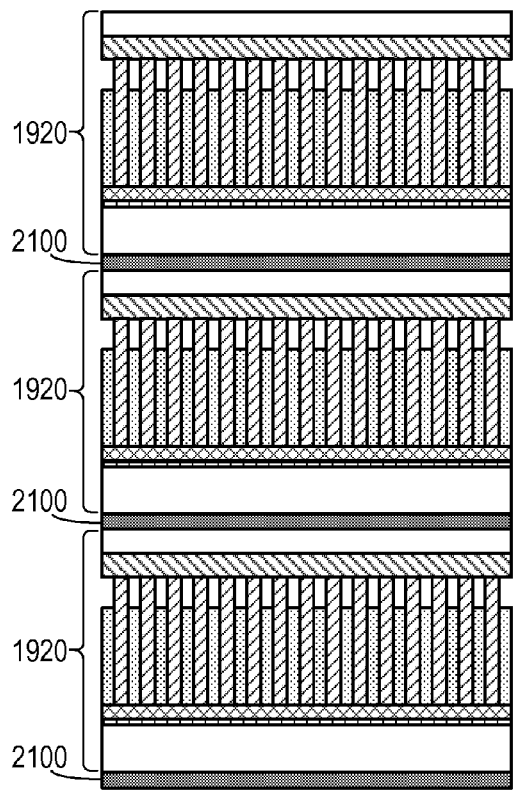
FIG. 20 is a schematic diagram of a stacked generator employing the embodiment shown in FIGS. 18A-18E

As shown in FIG. 20, by depositing a thin insulative film 2100 between each structure 1920, a layer-by-layer integration of the individual layers is possible. In such a case, a 3D structured nanogenerator may be built to have enhanced output voltage and current characteristics. Such a structure could used to harvest walking energy by being built into shoes and floors. It could also be built into tires to power embedded sensors and it could even be built into roads to harvest energy from running vehicles. As will be clearly appreciated, this embodiment could be employed in many different embodiments.

In one experimental embodiment, the substrate for the following synthesis can be metal, conductive glass, or even conductive polymer. Here we give an example of using silicon. A piece of silicon wafer is cleaned by a standard cleaning process. It is ultrasonicated in sequence in acetone, ethanol, IPA and deionized water each for ten minutes, and then blown dry by nitrogen gas. The silicon wafer is placed in a box furnace, annealing at 800 Celsius degrees for half an hour to generate a thick layer of $SiO_2$.

Then the wafer is coated with about 1 μm thick layer of Au by magnetron sputter under 25 sccm Ar as the sputtering gas and 350 V voltage and 40 mA direct current. The deposition rate is about 1 angstrom per second. The purpose to make Au layer that thick is to make the Au layer robust enough when being fabricated into nanogenerator later on. In between the $SiO_2$ surface and the Au layer, a thin layer of titanium is sputtered as an adhesion layer which buffers the huge lattice mismatch between $SiO_2$ surface and Au (111) face. After that, the whole substrate is annealed at 300 Celsius degrees for half an hour to reduce the lattice strain in the Au layer.

The Au can be lifted off by etching away the SiO$_2$ layer with 1% HF solution. Using higher concentration of HF solution would end up with very rough surface Au layer. Because the hydrophobic property of Au, when immersed in water solution for very long time, the Au layer would crumple up. To improve the surface smoothness of the Au layer, thioglycolic acid is added into the HF solution as to modify the surface property of the Au layer, changing it from hydrophobic to hydrophilic, because the thio group in thioglycolic acid will bind strongly to Au atoms, leaving the carboxyl group inside the solution body. The thioglycolic acid concentration is around 1 mmol/L.

On the Au layer, a layer of 50 nm ZnO seed is sputtered by magnetron sputter under 25 sccm Ar and 75 W radio frequency with 10% tune and 60% load. The deposition rate is about 0.4 angstrom per second. After that, the Au layer with ZnO seed is annealed at 300 Celsius degrees to improve the normal orientation of the ZnO seed to <0001>.

The growth of ZnO nanowire arrays take place in the 5 mM of zinc nitrate and hexamethylenetetramine solution in a way that due to surface tension of nutrient solution the Au layer is floating with face down on the surface of the nutrient solution, which means to immerse the ZnO seed layer inside the nutrient solution. The growth takes place at 70 Celsius in a mechanical convection oven for 24 hours. An advantage of floating the substrate on the nutrient solution surface but not putting it at the bottom of the nutrient solution is that when heating up the solution, nucleation also takes place inside the solution body. When those nucleation grow large enough, ZnO particles would precipitate out and falls down to the substrate which is located at the vessel bottom. Those precipitation fallen onto the substrate will consume the nutrient from the solution and hinder the growth of aligned ZnO nanowires on the Au surface.

Then a sample of the as grown ZnO nanowire array is rinsed with ethanol to remove any organic residues adsorbed on the ZnO nanowires' surface. Then it is coated with a layer of Au by magnetron sputter in the same way as stated previously.

A sample of ZnO nanowire arrays with Au coating and a sample of ZnO nanowire arrays without Au coating are compacted face to face together. The sample with Au coating acts as the top zigzag top electrode. When we press the compacted electrodes by external mechanical force or vibrational force, the ZnO nanowire arrays will bend, generating a positive potential side and a negative potential side. The top Au coated ZnO nanowires act as an array of AFM tips, selectively collecting the separated charges by virtue of a coupled effect of piezoelectric and semiconducting properties of ZnO nanowire arrays.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An electric power generator, comprising:
   a. a first conductive layer having a first surface;
   b. a plurality of semiconducting piezoelectric nanostructures extending upwardly from the first surface;
   c. a second conductive layer having a second surface and disposed parallel to the first conductive layer so that the second surface faces the first surface of the first conductive layer;
   d. a plurality of conductive nanostructures depending downwardly from the second surface,
   the second conductive layer spaced apart from the first conductive layer at a distance so that when a force is applied to at least one of the first conductive layer and the second conductive layer, at least one of the semiconducting piezoelectric nanostructures engages at least one of the plurality of conductive nanostructures so that the at least one of the semiconducting piezoelectric nanostructures bends, thereby generating a potential difference across the at least one of the semiconducting piezoelectric nanostructures and also thereby forming a Schottky barrier between the at least one of the semiconducting piezoelectric nanostructures and the at least one of the conductive nanostructures.

2. The electric power generator of claim 1, wherein the first conductive layer and the second conductive layer each comprise a metal.

3. The electric power generator of claim 2, wherein the metal comprises gold.

4. The electric power generator of claim 1, wherein the semiconducting piezoelectric nanostructures comprise zinc oxide nanowires.

5. The electric power generator of claim 1, wherein each of the conductive nanostructures comprises:
   a. a zinc oxide core; and
   b. a gold outer shell.

6. A stacked electric power generator, comprising:
   a. a first conductive layer having a first surface, a plurality of semiconducting piezoelectric nanostructures extending upwardly from the first surface;
   b. a second conductive layer having a second surface and disposed parallel to the first conductive layer so that the second surface faces the first surface of the first conductive layer, a plurality of conductive nanostructures depending downwardly from the second surface,
   c. a plurality of intermediate conductive layers disposed between the first conductive layer and the second conductive layer, each intermediate conductive layer having an downwardly-facing surface facing the first conductive layer and an upwardly-facing surface facing the second conductive layer, a plurality of semiconducting piezoelectric nanostructures extending upwardly from each upwardly-facing surface and a plurality of conductive nanostructures depending downwardly from the downwardly facing surface,
   the first conductive layer, the second conductive layer and each of the plurality of intermediate conductive layers spaced apart so at a distance so that when a force is applied to at least one of the first conductive layer and the second conductive layer, at least one of the semiconducting piezoelectric nanostructures engages at least one of the plurality of conductive nanostructures so that the at least one of the semiconducting piezoelectric nanostructures bends, thereby generating a potential difference across the at least one of the semiconducting piezoelectric nanostructures and also thereby forming a Schottky barrier between the at least one of the semiconducting piezoelectric nanostructures and the at least one of the conductive nanostructures.

7. A method of making an electric power generator, comprising the actions of:
   a. creating a plurality of generating units, each generating unit created by:

i. growing a plurality of semiconducting piezoelectric nanostructures extending upwardly from a first surface of a first conductive layer; and ii. growing a plurality of conductive nanostructures depending downwardly from a second surface of the first conductive layer, thereby creating a generating unit; and b. stacking a plurality of generating units to form stacked generating units so that each second conductive layer of a first generating unit is spaced apart from the first conductive layer of a second generating unit at a distance so that when a force is applied to at least one of the first conductive layer and the second conductive layer, at least one of the semiconducting piezoelectric nanostructures engages at least one of the plurality of conductive nanostructures so that the at least one of the semiconducting piezoelectric nanostructures bends, thereby generating a potential difference across the at least one of the semiconducting piezoelectric nanostructures and also thereby forming a Schottky barrier between the at least one of the semiconducting piezoelectric nanostructures and the at least one of the conductive nanostructures.

8. The method of claim 7, wherein the first conductive layer comprises a metal.

9. The method of claim 8, wherein the metal comprises gold.

10. The method of claim 7, wherein the semiconducting piezoelectric nanostructures comprise zinc oxide nanowires.

11. The method of claim 7, wherein each of the conductive nanostructures comprises:

a. a zinc oxide core; and
b. a gold outer shell.

12. A method of making a generator, comprising the actions of:

a. applying a layer of metal film on a conductive substrate;
b. annealing the metal film at a preselected temperature to form a textured metal film;
c. growing a plurality of aligned piezoelectric semiconducting nanowires from the textured metal film;
d. infiltrating a layer of an insulative and elastic polymer into the piezoelectric semiconducting nanowires;
e. etching the layer of insulative and elastic polymer so as to expose tips of the piezoelectric semiconducting nanowires; and
f. depositing a metal layer onto the layer of insulative and elastic polymer so that the metal layer is in contact with the tips of the piezoelectric semiconducting nanowires.

13. The method of claim 12, wherein the annealing action includes heating the piezoelectric semiconducting film to at least 350° C.

14. The method of claim 12, wherein the action of growing a plurality of aligned piezoelectric semiconducting nanowires includes ensuring that a [0001] crystal face of the piezoelectric semiconducting nanowires is upwardly disposed.

15. The method of claim 12, wherein the action of growing a plurality of aligned piezoelectric semiconducting nanowires employs wet chemical deposition.

16. The method of claim 12, wherein the action of growing a plurality of aligned piezoelectric semiconducting nanowires employs chemical vapor deposition.

17. The method of claim 12, further comprising the action of applying an insulating layer to a bottom face of the conductive substrate to form a generating unit.

18. The method of claim 17, further comprising the action of stacking a plurality of generating units to form a stacked generator.

* * * * *